(12) United States Patent
Jajodia et al.

(10) Patent No.: US 9,154,135 B1
(45) Date of Patent: Oct. 6, 2015

(54) SPARE GATE CELL FOR INTEGRATED CIRCUIT

(71) Applicants: Reecha Jajodia, Noida (IN); Gaurav Goyal, Dehradun (IN)

(72) Inventors: Reecha Jajodia, Noida (IN); Gaurav Goyal, Dehradun (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/262,795

(22) Filed: Apr. 27, 2014

(51) Int. Cl.
| | |
|---|---|
| *H01L 25/00* | (2006.01) |
| *H03K 19/00* | (2006.01) |
| *H03K 19/177* | (2006.01) |
| *H03K 19/173* | (2006.01) |
| *H03K 19/003* | (2006.01) |

(52) U.S. Cl.
CPC .... *H03K 19/17724* (2013.01); *H03K 19/00392* (2013.01); *H03K 19/1736* (2013.01); *H03K 19/17748* (2013.01); *H03K 19/17764* (2013.01)

(58) Field of Classification Search
CPC ............... H03K 19/17728; H03K 19/17764; H03K 19/17796; H03K 19/1736; H03K 19/1774; H01L 25/00; H01L 2924/0002; H01L 2924/00
See application file for complete search history.

(56) References Cited

U.S. PATENT DOCUMENTS

| | | | |
|---|---|---|---|
| 6,255,845 | B1 | 7/2001 | Wong et al. |
| 6,791,355 | B2 | 9/2004 | Vergnes |
| 8,103,989 | B2 | 1/2012 | Dotson et al. |
| 8,810,280 | B2 * | 8/2014 | Pyapali et al. ............. 326/102 |
| 2010/0231256 | A1 | 9/2010 | Jain et al. |
| 2013/0088261 | A1 * | 4/2013 | Pyapali et al. ............. 326/102 |

* cited by examiner

*Primary Examiner* — Vibol Tan
(74) *Attorney, Agent, or Firm* — Charles Bergere

(57) ABSTRACT

Spare gate cells for inclusion in an integrated circuit have multiple inputs and outputs and are capable of selectively performing, concurrently, multiple logic functions on signals appearing at the inputs. Selection of required logic functions depends on the connections of at least one of the inputs of the spare cell. One of the outputs is fed back to an input of the spare gate cell to provide certain functionality while other outputs are set to a fixed logical value. The spare gate cell may be configured to perform NOR, OR and inverter operations on inputs simultaneously.

6 Claims, 6 Drawing Sheets

| Setting | A | B | C | D | E | F | G | H | Q1 | Q2 | Q3 |
|---|---|---|---|---|---|---|---|---|---|---|---|
| 1 | | | 0 | 0 | | | | 0 | (E.F)' | E.E+H' | AE'H+AF'HAG'+A'B' |
| 2 | | | 0 | 0 | | | 0 | 0 | (E.F)' | E.F | A+A'B' |
| 3 | 1 | | 0 | 0 | | 1 | Q1 | 1 | E' | E | 0 |
| 4 | | 1 | 0 | 0 | | | Q1 | 1 | (E.F)' | E.F | A(E'+F'+E.F) |
| 5 | | 1 | 0 | 0 | | | Q1 | 0 | (E.F)' | 1 | AEF |
| 6 | 1 | | 0 | 0 | | | 1 | | (E.F)' | E.F+H' | (E.F)'.H |
| 7 | 1 | | 0 | 0 | | | | 1 | (E.F)' | E.F | (E.F.G)' |

FIG. 4

| Setting | A | B | C | D | E | F | G | H | Q1 | Q2 | Q3 |
|---|---|---|---|---|---|---|---|---|---|---|---|
| 8 | | | 0 | | | 1 | | | (D.E)' | D+E+H | AD'E'H+AG'+A'B' |
| 9 | 1 | | 0 | 0 | 0 | 1 | | | 1 | H' | H+G' |
| 10 | 0 | | 0 | | | 1 | | Q3 | (D+E)' | D+E+B | B' |
| 11 | 1 | | 0 | | | 1 | | 1 | (D.E)' | D+E | D'E+G' |
| 12 | | 1 | 0 | | | 1 | 1 | 0 | (D+E)' | 1 | AG' |
| 13 | | 1 | 0 | | | 1 | Q1 | 0 | (D+E)' | 1 | A(D+E) |
| 14 | Q2 | | 0 | | | 1 | 1 | 0 | (D+E)' | D+E | (A+D+E)' |
| 15 | Q2 | | 0 | 1 | | 1 | Q1 | 1 | E' | E | A⊙E |
| 16 | Q1 | | 0 | 0 | | 1 | 1 | 1 | E' | E | A⊕E |

FIG. 6

| Setting | A | B | C | D | E | F | G | H | Q1 | Q2 | Q3 | Q4 |
|---|---|---|---|---|---|---|---|---|---|---|---|---|
| 17 | 1 |   | CLK |   |   |   |   |   |   |   |   | Set & Reset Scan type FF |
| 18 | 1 |   | CLK |   |   |   |   | 1 |   |   |   | Reset Scan FF |
| 19 | 1 |   | CLK |   |   |   | 1 | 1 |   |   |   | D-Scan FF |
| 20 | 1 |   | CLK |   |   |   | 1 |   |   |   |   | Set Scan FF |
| 21 |   | Q1 | 0 | 0 |   |   | 1 | 1 |   |   | Tri-state Inverter |   |
| 22 | 1 |   | CLK | 0 |   |   | 1 |   |   | -ve Set latch | (-ve Set latch)' |   |
| 23 | 1 |   | CLK | 0 |   |   |   | 1 |   | -ve latch | (-ve latch)' |   |
| 24 |   |   | 0 |   |   |   | 1 | 1 | (DE+FE')' MUX | (DE+FE') MUX |   |   |
| 25 | 0 |   | 1 |   |   |   |   |   |   |   |   |   |
| 26 | 0 |   | 1 |   |   |   | 1 |   |   |   |   |   |
| 27 | 0 |   | CLK |   |   |   | 1 | 1 |   |   | B' | ((B'.H)'.G)' |
| 28 | 0 |   | CLK |   |   |   | 1 |   |   |   | B' | (B'.H)' |
| 29 | 0 |   | CLK |   |   |   |   | 1 |   |   | B' | +ve latch |
| 30 | 0 |   | 0 | 0 |   |   |   |   | D' | (D'.H)'=D+H' | ((D'.H)+G')' .A+B'A' | +ve Set latch |
| 31 | 0 |   | 0 | 0 |   |   |   | 1 | D' | D | (A'B)' |   |

FIG. 8

SPARE GATE CELL FOR INTEGRATED CIRCUIT

BACKGROUND OF THE INVENTION

The present invention relates generally to spare gate cell circuitry and, more particularly, to configurable spare gate cells for inclusion in an integrated circuit.

Large integrated circuits such as a system-on-chip (SOC) device have many logic circuits. Often, the circuit design must be updated or changed to correct errors or bugs discovered during simulations and testing. For example, during de-bugging, last minute changes to the SOC design, sometimes called Engineering Design Orders (ECO) are made by connecting one or more spare cells already located in the design to implement the correction. A typical spare gate cell includes a collection of transistors coupled together into a pre-defined logic gate or other functional logic circuit, which can then be used to perform a certain function. These pre-defined spare gates can be configured to implement various logic functions such as NAND, NOR, inverter, etc.

One known spare gate cell includes a configurable building block circuit having at least two inputs and an output. The configurable building block circuit is capable of selectively performing a plurality of possible logic functions on signals appearing on the inputs to produce a logic signal on the output, where selection of a logic function depends on connections of the input leads of the configurable building block circuit.

The increasing pressure of time-to-market has forced IC designers to improve capability of handling incremental design changes. These design changes, known as Engineering Change Orders or ECOs, are requested after silicon chips have been manufactured, thus the photo masks need to be changed. Since it is expensive to change the photo masks, it is more efficient and less expensive if the ECO can be implemented by changing only one or more of the metal layers of the design (used for interconnect), while the base layers (for cells) remain the same.

Most current VLSI (very large scale integration) circuits are constructed with at least three metal layers and usually seven or more metal layers. Implementing changes in the metal layer is only feasible if the spare cell corresponding to the desired functionality already exists in the layout of the SOC. Thus, spare cells usually are sprinkled throughout a design. However, a further complication is that only one logic function can be performed by a spare cell at any one time so that 'n' spare cells are required to perform 'n' functionalities. Therefore, silicon area and power requirements are high.

Thus, it would be advantageous to provide a spare cell that mitigates the above disadvantages of known arrangements.

BRIEF DESCRIPTION OF THE DRAWINGS

The invention, together with objects and advantages thereof, may best be understood by reference to the following description of preferred embodiments together with the accompanying drawings in which:

FIG. 4 is a table illustrating a first set of possible logical operations capable of being performed by the spare gate cell of FIG. 3;

FIG. 6 is a table illustrating a second set of possible logical operations capable of being performed by the spare gate cell of FIG. 3;

FIG. 8 is a table illustrating a third set of possible logical operations capable of being performed by the spare gate cell of FIG. 3.

DETAILED DESCRIPTION OF PREFERRED EMBODIMENTS

Figure 1:
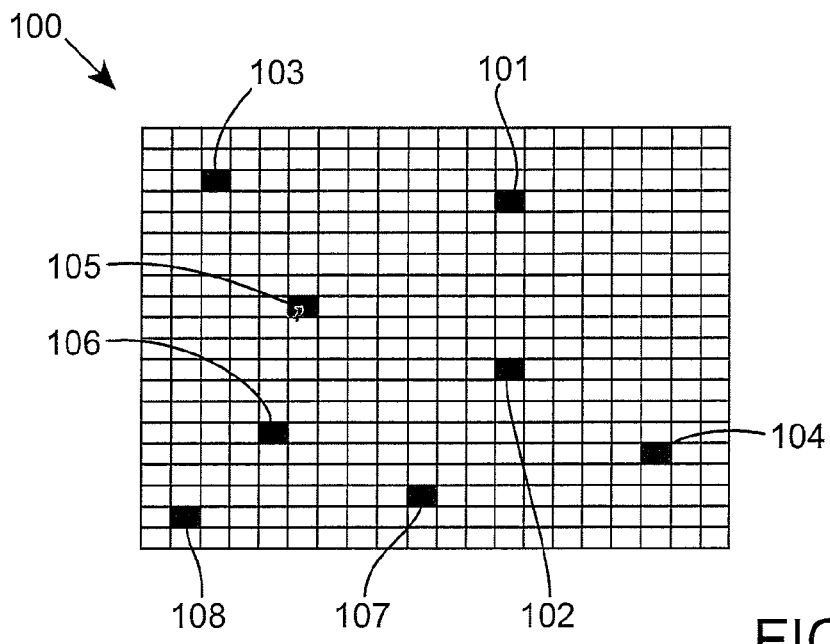
FIG. 1 is a simplified schematic diagram of an integrated circuit that has a plurality of spare cells in accordance with an embodiment of the invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a spare cell having at least two inputs and at least two outputs, the spare cell being capable of selectively performing, concurrently, a plurality of logic functions on signals appearing at the inputs to produce logic signals at the outputs, where selection of the plurality of logic functions depends on connections of at least one of the inputs of the spare cell. Optionally, an output of the spare cell may be connected to an input of the spare cell.

Advantageously, a plurality of different functionalities can be provided simultaneously by the same spare cell. Thus, depending on different input configurations, different, concurrent multi-output operations can be realized. This saves on silicon area and power consumption compared with known arrangements. A further advantage is that the spare cell can be connected and configured by making a change only to a metal layer of the IC design. Thus, there is no need to recreate costly photo masks. Changes in the cell's physical connections are made only at the input/output pins, and no internal nodes need to be modified.

In one example embodiment, several multi-functionality spare cells in accordance with the invention may be implemented in an integrated circuit and may be distributed at random locations throughout the circuit. By using spare cells in accordance with the invention in this way, the probability of finding a desired functionality close to an ECO site, or of implementing a particular functionality 'N' times, is increased.

In one example embodiment, a spare cell is configured to provide a function set of logical operations to be performed on a sub-set of its inputs by setting, at a predetermined logical value, at least one input, which is not included in the subset, to predetermined logical values and/or connecting it to an output of the spare gate cell.

In one example embodiment, a first function set of logical operations comprises a buffer, inverter, NAND and AND. One example of a multiplicity of logical functions that can be performed concurrently with this first functional set includes an AND operation on two inputs, a NAND operation on three inputs, and a NAND operation on two inputs.

In another example embodiment, a second function set of logical operations includes a buffer, inverter, XOR, exclusive NOR, NOR, OR, and AND. One example of a plurality of logical functions that can be performed concurrently with this second functional set comprises an inverter, a buffer and an XNOR (exclusive NOR).

In a further example embodiment, a third function set of logical operations comprises NAND, negative latch, positive latch, multiplexer, tri-state inverter, set and reset or set or reset scanning flip-flop. One example of a plurality of logical functions that can be performed concurrently with this third functional set comprises an inverter and a positive latch.

By re-configuring the inputs of the spare cell of the present invention, alternative function sets can be implemented.

An example of a spare gate cell in accordance with the invention may comprise a plurality of building blocks. In one example, the building blocks include a multiplexer, a latch and a scan flip-flop.

An integrated circuit, such as a SOC, may include one or several or many spare cells of the present invention. One of the spare cells may be configured to have a different functional set from another spare cell.

Referring now to FIG. 1, an integrated circuit 100 is shown. The integrated circuit 100 may comprise, for example, a system-on-chip (SOC) device or an ASIC. The integrated circuit 100 includes a plurality of spare gate cells that are arranged in a random fashion in the integrated circuit device 100. Eight spare gate cells 101-108 are shown in FIG. 1 but fewer or more than eight may be included in other examples. One or more of the spare gate cells 101-108 may be used and set to have a desired functionality by making changes in the appropriate metal layer of the integrated circuit device 100.

Figure 2:
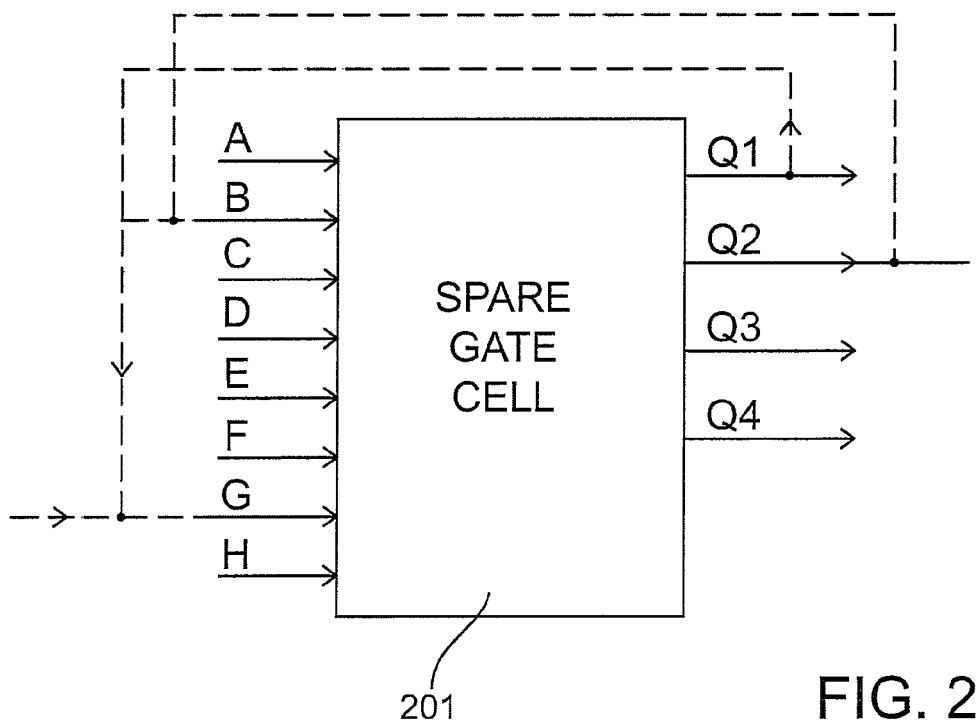
FIG. 2 is a simplified block diagram of one of the spare cells included in the integrated circuit device of FIG. 1 in accordance with an embodiment of the present invention.

Referring now to FIG. 2, a spare gate cell 201 has eight inputs labelled A through H and four outputs labelled Q1, Q2, Q3, Q4. The spare cell 201 comprises transistor-transistor logic (TTL) circuitry capable of performing, concurrently, several of the plurality of logical operations in a manner to be described below. A subset of the inputs A to H are used as signal inputs and these signals are operated on by the circuitry of the spare cell 201 to produce logical output values at the outputs Q1 to Q4. The remaining inputs that are not included in the subset are used as selection (or control) inputs and depending on the logical value of these selection inputs, the circuitry of the spare cell 201 performs certain logical operations on at least some of the subset of inputs in order to produce certain output values at the outputs Q1 to Q4. In some example embodiments, one or more outputs are fed back to one or more inputs of the spare cell 201.

FIG. 2 illustrates the possibility of input B receiving either output Q1 or Q2 and input G receiving output Q2. In one example, the spare cell 201 comprises basic building blocks that include a multiplexer, a latch and a scan flip-flop. In some examples, the spare cell 201 also includes one or more inverters (NOT gates) that can be selectively employed to invert or buffer an input for serving as either an input to another part of the circuitry of the spare cell 201. In other examples, some of the circuitry of a multiplexer or a latch is employed to perform simple logic gate operations such as a NAND operation.

Figure 3:
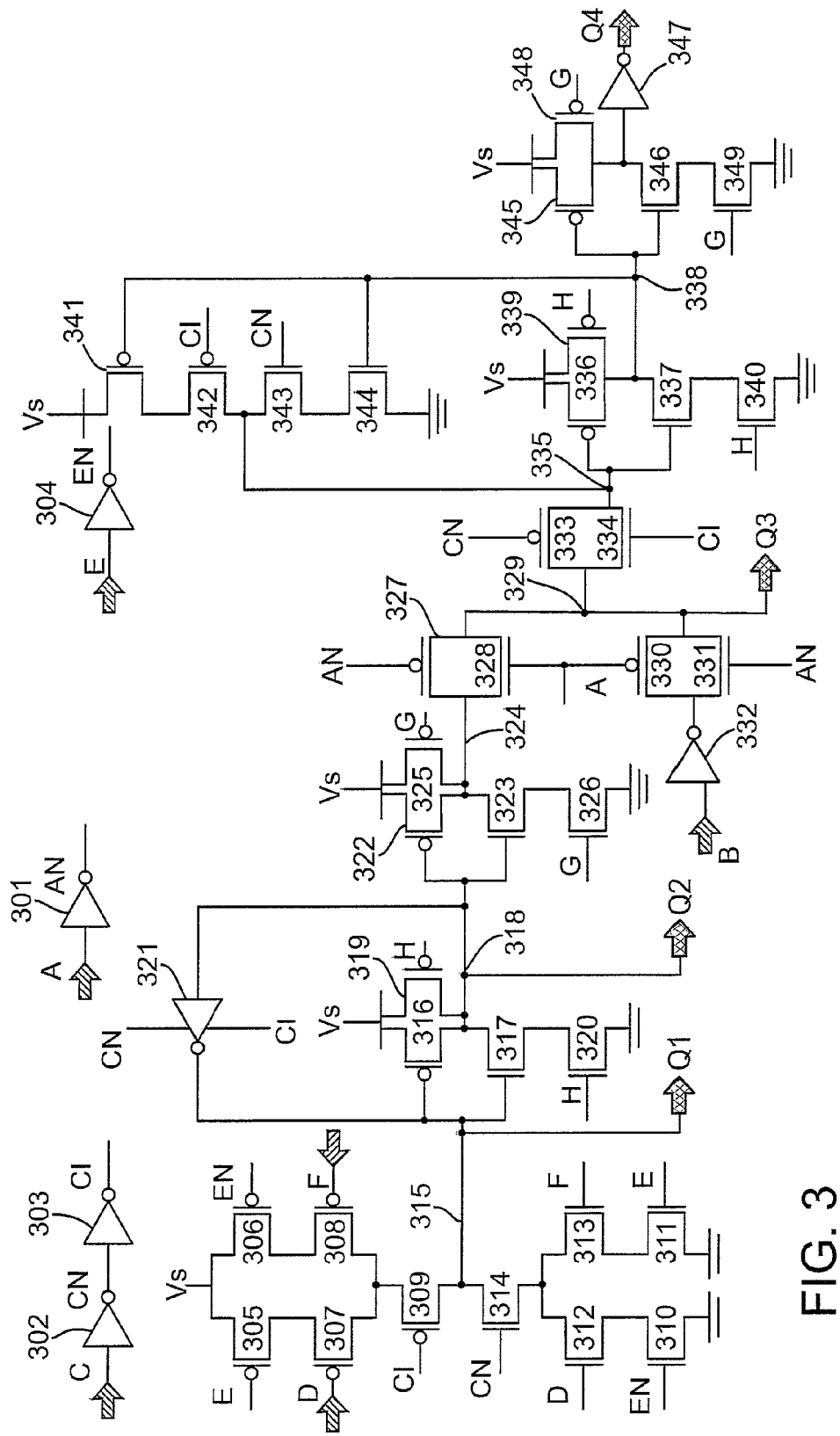
FIG. 3 is a schematic circuit diagram of a spare gate cell in accordance with an embodiment of the invention.

With reference now to FIG. 3, a simplified circuit diagram of the spare cell 201 of FIG. 2 is illustrated. Hence, the circuit of FIG. 3 has eight inputs, A through H and four outputs Q1-Q4. In FIG. 3 (and FIGS. 5 and 7), the annotations AN, CN and EN mean "NOTTED" (or inverted) versions of the inputs A, C and E respectively. The annotation CI means a twice inverted (or buffered) version of the input C.

A first inverter 301 receives input A and produces an inverted version AN at its output. A second inverter 302 receives input C and produces an inverted version CN, which in turn is fed to a third inverter 303, which produces a twice inverted version CI at its output. A fourth inverter 304 receives input E and produces an inverted version EN at its output.

A first transistor 305, which comprises a P-MOSFET (metal oxide semiconductor field effect transistor) receives input E on its gate terminal. A second transistor 306, which comprises P-MOSFET receives EN (i.e. the inverted version of input E) at its gate terminal. Source terminals of the first and second transistors 305 and 306 are connected to a supply voltage Vs. A third transistor 307, which also is a P-MOSFET, receives input D at its gate terminal. Its source terminal is connected to the drain terminal of the first transistor 305. A fourth transistor 308, also a P-MOSFET has a gate terminal that receives input F. The source terminal of the fourth transistor 308 is connected to the drain terminal of the second transistor 306. The drain terminals of both third and fourth transistors 307, 308 are connected to a source terminal of a fifth transistor 309, which also is a P-MOSFET. The gate terminal of the fifth transistor 309 receives CI. A sixth transistor 310, which comprises an N-MOSFET, receives input EN on its gate terminal. A seventh transistor 311, which is an N-MOSFET receives input E on its gate terminal. Source terminals of the sixth and seventh transistors 310, 311 are connected to ground. An eighth transistor 312, which is an N-MOSFET receives input D on its gate terminal and its source terminal is connected to the drain terminal of the sixth transistor 310. A ninth transistor 313, which is an N-MOSFET, receives input F of its gate terminal and its source terminal is connected to the drain terminal of the seventh transistor 311. The drain terminals of the eighth and ninth transistors 312, 313 are connected to a source terminal of a tenth transistor 314, which is an N-MOSFET. The tenth transistor 314 receives CN on its gate terminal. The drain terminal of the tenth transistor 314 is connected to the source terminal of the fifth transistor 309 at a first node 315.

The first node 315 serves as the output Q1. The first through tenth transistors (305-314) form a multiplexer building block whose output comprises one of the outputs of the spare cell 201. The first node 315 and also serves as an input to a further stage of the circuitry, which includes a building block comprising configurable logic gates. The first node 315 is connected to the gate terminals of eleventh and twelfth transistors 316, 317. The eleventh transistor 316 comprises a P-MOSFET whose source terminal is connected to the voltage supply Vs and whose drain terminal is connected to a second node 318. Connected in parallel with the eleventh transistor 316 is a thirteenth transistor 319, which is also a P-MOSFET. The source terminal of the thirteenth transistor 319 is connected to the voltage supply Vs and its drain terminal is connected to the second node 318, while its gate terminal receives the input H. The twelfth transistor 317 is an N-MOSFET whose drain terminal is connected to the second node 318 and whose source terminal is connected to a drain terminal of a fourteenth transistor 320. The fourteenth transistor 320 comprises an N-MOSFET and has its source terminal connected to ground and its gate terminal receives the input H. The second node 318 serves as an output of the building block comprising the eleventh, twelfth, thirteenth and fourteenth transistors and also serves as the output Q2 of the spare cell 201.

An additional element 321 comprising a tri-state inverter is connected across the outputs Q2 and Q1 with its input being connected to Q2 and its output being connected to Q1. The additional element 321 also receives the signals CN and CI. The additional element functions as a tri-state inverter, which retains the state of the first node 315 when CI is a logical "1." The second node 318 also serves as an input to a subsequent building block comprising a latch. The second node 318 is connected to the gate terminals of fifteenth and sixteenth transistors 322, 323. The fifteenth transistor 322 is a P-MOSFET whose source terminal is connected to the voltage supply Vs and whose drain terminal is connected to a third node 324. Connected in parallel with the fifteenth transistor 322 is a seventeenth transistor 325, which is also a P-MOSFET. The source terminal of the seventeenth transistor 335 is connected to the voltage supply Vs, its drain terminal is connected to the second node 318, and its gate terminal receives the input G. The sixteenth transistor 323 comprises an N-MOSFET whose drain terminal is connected to the third node 324 and whose source terminal is connected to a drain terminal of a an eighteenth transistor 326. The eighteenth transistor 326 comprises an N-MOSFET and has its source terminal connected to ground and its gate terminal receives the input G. The third node 324 is connected to a source terminal of a nineteenth transistor 327, which comprises a P-MOSFET. The nineteenth transistor 327 is connected in parallel with a twentieth transistor 328, which comprises an N-MOSFET. The gate terminal of the nineteenth transistor 327 receives the input AN and its drain terminal is connected to a fourth node 329. The drain terminal of the twentieth transistor 328 is connected to the third node 324, its source terminal is connected to the fourth node 329, and its gate terminal is connected to a gate terminal of a twenty-first transistor 330. The gate terminals of the twentieth and twenty-first transistors 328, 330 both receive the input A. The twenty-first transistor 330 comprises a P-MOSFET and is connected in parallel with a twenty-second transistor 331, which comprises an N-MOSFET. The drain terminal of the twenty-first transistor 330 and the source terminal of the twenty-second transistor 331 are both connected to the fourth node 329. The source terminal of the twenty-first transistor 330 and the drain terminal of the twenty-second transistor 331 are connected to an output of a fifth inverter 332 whose input receives the input B. The fourth node 329 serves as the output Q3 of the spare cell 201 and also as an input to a subsequent building block comprising a scan flip-flop.

The fourth node 329 is connected to a source terminal of a twenty-third transistor 333 which comprises a P-MOSFET. The twenty-third transistor 333 is connected in parallel with a twenty-fourth transistor 334, which comprises an N-MOSFET. The gate terminal of the twenty-third transistor 333 receives the input CN and its drain terminal is connected to a fifth node 335. The drain terminal of the twenty-fourth transistor 334 is connected to the fourth node 329, its source terminal is connected to the fifth node 329, and its gate terminal is connected to CI. The fifth node 335 is connected to gate terminals of twenty-fifth and twenty-sixth transistors 336, 337. The twenty-fifth transistor 336 comprises a P-MOSFET whose source terminal is connected to the voltage supply Vs and whose drain terminal is connected to a sixth node 338. Connected in parallel with the twenty-fifty transistor 336 is a twenty-seventh transistor 339, which is also a P-MOSFET. The source terminal of the twenty-seventh transistor 339 is connected to the voltage supply Vs, its drain terminal is connected to the fifth node 338, and its gate terminal receives the input H. The twenty-sixth transistor 337 comprises an N-MOSFET whose drain terminal is connected to the sixth node 338 and whose source terminal is connected to a drain terminal of a twenty-eighth transistor 340. The twenty-eighth transistor 340 comprises an N-MOSFET and has its source terminal connected to ground and its gate terminal receives the input H. The fifth node 335 and the sixth node 338 are connected to a transistor array. The transistor array comprises a twenty-ninth transistor 341, which comprises a P-MOSFET whose source terminal is connected to the voltage supply Vs, whose gate terminal is connected to the sixth node 338, and whose drain terminal is connected to a source terminal of a thirtieth transistor 342. The thirtieth transistor 342 comprises a P-MOSFET whose gate terminal receives the input C1 and whose drain terminal is connected to a drain terminal of a thirty-first transistor 343. The drain terminals of the thirtieth and thirty-first transistors 342, 343 are also connected to the fifth node 335. The thirty-first transistor 343 comprises an N-MOSFET whose gate terminal receives the input CN and whose source terminal is connected to a thirty-second transistor 344. The thirty-second transistor 344 comprises an N-MOSFET whose source terminal is connected to ground and whose gate terminal is connected to the sixth node 338. The sixth node 338 is also connected to gate terminals of thirty-fourth and thirty-fifth transistors 345, 346. The thirty-fourth transistor 345 comprises a P-MOSFET whose source terminal is connected to the voltage supply Vs and whose drain terminal is connected to an input of a sixth inverter 347. Connected in parallel with the thirty-fourth transistor 345 is a thirty-sixth transistor 348, which is also a P-MOSFET. The source terminal of the thirty-sixth transistor 348 is connected to the voltage supply Vs, its drain terminal is connected to the input of the sixth inverter 347, and its gate terminal receives the input G. The thirty-fifth transistor 346 comprises an N-MOSFET whose drain terminal is connected to the input of the sixth inverter 347 and whose source terminal is connected to a drain terminal of a thirty-seventh transistor 349. The thirty-seventh transistor 349 comprises an N-MOSFET and has its source terminal connected to ground and its gate terminal receives the input G. An output of the sixth inverter 347 serves as the output Q4 of the spare cell.

Figure 5:
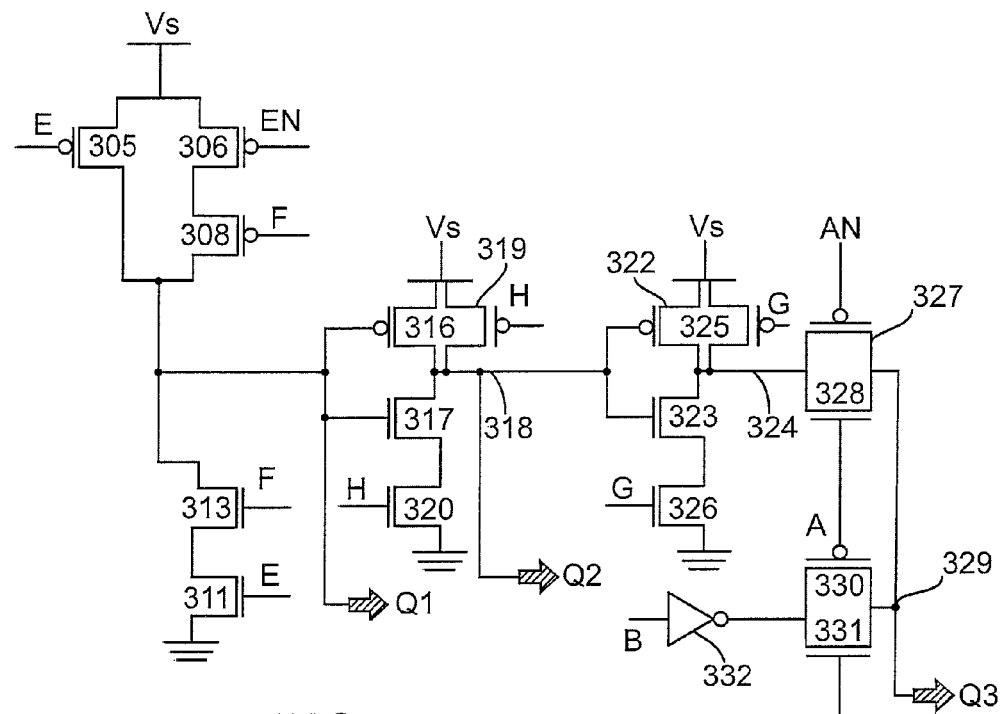
FIG. 5 is a schematic circuit diagram of the spare gate cell of FIG. 3 being used to implement a first set of functions in accordance with an embodiment of the present invention.

Referring now to the table of FIG. 4 and the circuit diagram of FIG. 5, two or more of the inputs A-H of the circuit of FIG. 3 are used as selection (or control) inputs so that when they are set at some fixed logical value ("0" or "1") or connected to the output Q1, is capable of performing a multiplicity of selectable logic functions and further, is also capable of performing, concurrently, a plurality of logic functions. A first function set is illustrated in the table of FIG. 4 where settings labelled 1 through 7 relate to different logical operations depending on connections of the inputs. For this first function set, the inputs C and D are set to a logical "0." The remaining inputs A, B and E-H comprise a subset of inputs and the circuitry of the spare gate cell performs logical operations on this subset of inputs to provide output values at Q1, Q2 and Q3 as shown in the table of FIG. 4. When the inputs C and D are set to logical "0" the circuit of FIG. 3 reduces to that shown in FIG. 5. Comparing the circuits of FIGS. 3 and 5 reveals that the scan flip-flop is unused and that only certain components of the multiplexer are active and are used as logic gates.

Referring to the table of FIG. 4 again, it can be seen that for the setting labelled 1, the circuit performs logic operations on the subset of inputs such that output Q1 gives the result of input E NANDed with input F, output Q2 is the result of Boolean operations on inputs E, F and H and output Q3 is the result of further Boolean operations on the inputs A, B, E, F, G and H. All three outputs Q1, Q2 and Q3 are available simultaneously for use in the integrated circuit of FIG. 1, for example. Seven different settings are shown in the table of FIG. 4 for various connections of the inputs. As another example, for setting number 3, the inputs A, F, G and H on used as additional control inputs with the subset of inputs comprising just B and E. In this example, the output Q1 is fed back to input G and the inputs A, F and H are set to a logical "1". This setting provides, simultaneously, an inverted version of input E (at output Q1) and a buffered version of input E at output Q2. Further inspection of the table of FIG. 4 reveals that this first function set can provide a logical functions which include; buffer, inverter, a first NAND operation, second NAND operation, a first AND operation and a second AND operation.

Figure 7:
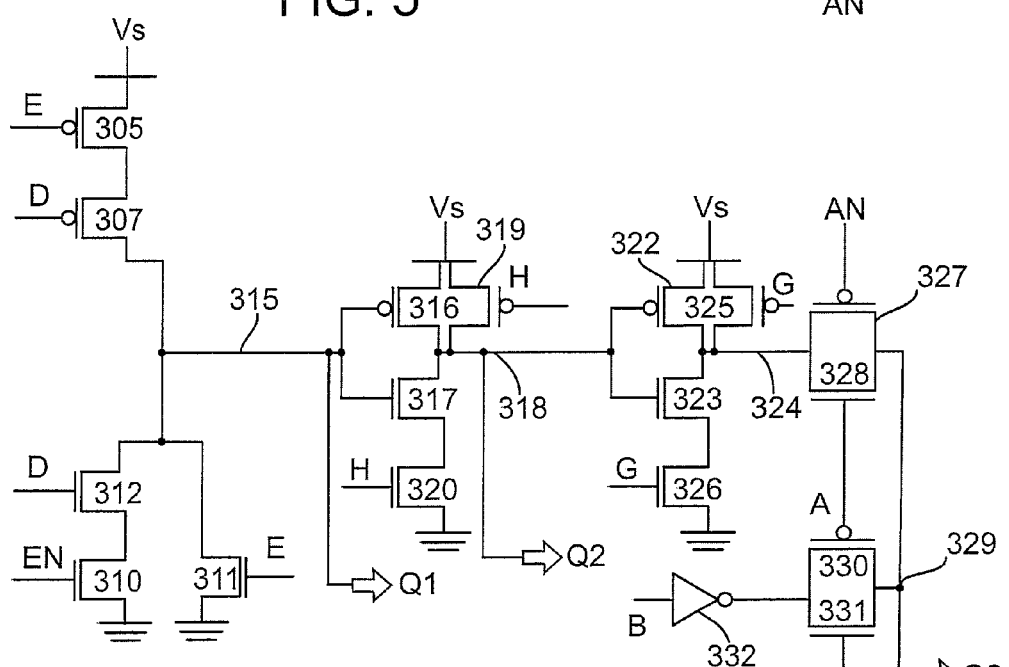
FIG. 7 is a schematic circuit diagram of the spare gate cell of FIG. 3 being used to implement a second set of functions in accordance with an embodiment of the present invention.

Referring now to the table of FIG. 6 and the circuit diagram of FIG. 7, two or more of the inputs A-H of the circuit of FIG. 3 are again used as selection (or control) inputs with the remaining inputs comprising a subset to be operated on by the circuitry of the spare cell. A second function set is illustrated in the table of FIG. 6 where settings labelled 8 through 16 relate to different logical operations depending on connections of the inputs. For this second function set, the input C is set to a logical "0" and the input F is set to a logical "1." The remaining inputs A, B, D, E, G and H comprise the subset of inputs and the circuitry of the spare cell performs logical operations on this subset of inputs to provide output values at Q1, Q2 and Q3 as shown in the table of FIG. 6.

For example, when the input C is set to a logical "0" and the input F is set to a logical "1", the circuit of FIG. 3 reduces to that shown in FIG. 7. Comparing the circuits of FIGS. 3 and 7 reveals that the scan flip-flop is unused and that only certain components of the multiplexer are active and are used as logic gates.

Referring to the table of FIG. 6 again, it can be seen that for the setting labelled 8, the circuit performs logic operations on the subset of inputs such that output Q1 gives the result of input D "NORed" with input E, output Q2 is the result of Boolean operations on inputs D, E and H and output Q3 is the result of further Boolean operations on the inputs A, B, D, E, G and H. All three outputs Q1, Q2 and Q3 are available simultaneously for use in the integrated circuit of FIG. 1, for example. Nine different settings are shown in the table of FIG. 4 for various connections of the inputs. As another example, for setting number 16, the inputs B, D, G and H are used as additional control inputs with the subset of inputs comprising just A and E. In this example, the output Q1 is fed back to input B, inputs C and D are set at a logical "0" and the inputs F, G and H are set to a logical "1". This setting provides, simultaneously, an inverted version of input E (at output Q1), a buffered version of input E at output Q2 and input A XORed with input E at output Q3. Further inspection of the table of FIG. 6 reveals that this second function set can provide logical functions that include: buffer, inverter, AND, exclusive NOR, XOR, two NOR operations, and two OR operations.

Referring now to the table of FIG. 8 and the circuit diagram of FIG. 3, in some examples, two or more of the inputs A-H of the circuit of FIG. 3 are used as selection (or control) inputs with the remaining inputs comprising a subset to be operated on by the circuitry of the spare cell. In other examples, one or more inputs are used as control inputs and fixed at a logical value and another input is connected to an external clock signal. A third function set is illustrated in the table of FIG. 8 where settings labelled 17 through 31 relate to different logical operations depending on connections of the inputs.

In one example of this third function set, for the setting labelled 24, the input C is set to a logical "0" and the input H is set to a logical "1." With this setting, the spare cell operates as a multiplexer, selecting between inputs D and F under the control of input E (and its inverse EN). The result of the multiplexing operation can be taken from either output Q1 or output Q2 or both, one being an inverted version of the other.

In another example, for the setting labelled 17, by setting input A to a logical "1" and connecting a clock signal to input C, the spare cell performs the function of a scan flip-flop whose output can be taken from output Q4.

In a further example, for the setting labelled 29, when input A is set to a logical "0", the input H is set to a logical "1" and the input C is connected to a clock signal, the spare cell acts as a positive reset latch with an output at Q4 and can simultaneously provide an inverted version of input B on output Q3. In another example, for the setting labelled 21, the output Q1 is fed back into input B, inputs C and E are set at a logical "0" and inputs G and H are set at a logical "1". In this example, the spare cell acts as a tri-state inverter (at output Q3). Further inspection of the table of FIG. 8 reveals that this third set can provide logical functions that include: negative and positive latches, a multiplexer, a tri-state inverter, and set and reset/set/reset scan flip-flop.

While the above examples show a spare cell having eight inputs and four outputs, it will be understood that more or fewer inputs and outputs may be used to provide a multiplicity of concurrent operations.

It should now be clear that the present invention provides a spare cell that be used to implement one or more logic functions simultaneously, and that only the input/output pins of the spare cell need to be changed and not the intermediate nodes of the circuit. Thus, the cell can be configured by making changes only to metal-1.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities potentials may be reversed that signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals. Furthermore, the terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

The integrated circuit of FIG. 1 may be packaged with one or more other dies. That is, an integrated circuit device may comprise one or more dies in a single package with circuit elements formed on the dies and which are connectable to other components outside the package through suitable connections such as package pins and bond wires between the pins and the dies.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A spare gate cell, comprising:
   at least two inputs and at least two outputs, wherein the spare gate cell is capable of selectively performing, concurrently, a plurality of logic functions on signals appearing at the inputs to produce logic signals at the outputs, wherein selection of said plurality of logic functions depends on connections of at least one of the inputs of the spare cell,
   wherein at least one input, which is not included in a subset of inputs, is set to a predetermined logical value to provide a function set of logical operations to be performed on the sub-set of inputs.

2. A spare gate cell, comprising:
   at least two inputs and at least two outputs, wherein the spare gate cell is capable of selectively performing, concurrently, a plurality of logic functions on signals appearing at the inputs to produce logic signals at the outputs, wherein selection of said plurality of logic functions depends on connections of at least one of the inputs of the spare cell,
   wherein at least one input, which is not included in a subset of inputs, is connected to an output of the spare gate cell to provide a function set of logical operations to be performed on the sub-set of inputs.

3. The spare gate cell of claim 1, wherein the spare gate cell comprises a plurality of building blocks wherein the output of at least one building block is connected to an input of another building block and wherein an output of a building block comprises an output of the spare gate cell.

4. The spare gate cell of claim 3, wherein said plurality of building blocks includes a multiplexer, a latch and a scan flip-flop.

5. An integrated circuit, comprising:
   at least one spare gate cell having at least two inputs and at least two outputs, wherein the spare gate cell is capable of selectively performing, concurrently, a plurality of logic functions on signals appearing at the inputs to produce logic signals at the outputs, wherein selection of the plurality of logic functions depends on connections of at least one of the inputs of the spare gate cell,
   wherein at least one input of the spare gate cell, which is not included in a subset of inputs, is connected to an output of the spare gate cell to provide a function set of logical operations to be performed on the subset of inputs.

6. The integrated circuit of claim 5, wherein the integrated circuit includes a plurality of spare gate cells wherein at least one of said plurality of spare gate cells has a function set which is different from at least one other of said plurality of spare gate cells.

\* \* \* \* \*